(12) United States Patent
Tseng et al.

(10) Patent No.: US 8,757,845 B2
(45) Date of Patent: Jun. 24, 2014

(54) WIDE ANGLE BASED INDOOR LIGHTING LAMP

(75) Inventors: Chi Xiang Tseng, Kaohsiung (TW); Hsiao-Wen Lee, Hsinchu (TW); Sheng-Shin Guo, Wufeng Township, Taichung County (TW); Pei-Wen Ko, Zhubei (TW); Chih-Hsuan Sun, Kaohsiung (TW); Wei-Yu Yeh, Tainan (TW)

(73) Assignee: TSMC Solid State Lighting, Ltd., Hsinchu (TW)

( * ) Notice: Subject to any disclaimer, the term of this patent is extended or adjusted under 35 U.S.C. 154(b) by 226 days.

(21) Appl. No.: 13/194,538

(22) Filed: Jul. 29, 2011

(65) Prior Publication Data

US 2013/0027946 A1 Jan. 31, 2013

(51) Int. Cl.
*F21V 7/07* (2006.01)

(52) U.S. Cl.
USPC .................. 362/296.07; 362/311.09; 362/257

(58) Field of Classification Search
CPC .......... F21V 17/00; F21V 5/046; F21V 7/09; F21V 7/041; F21V 7/046; F21V 29/2256; F21V 7/0091; F12Y 2101/02
USPC .................... 362/235, 241, 244, 246, 311.01, 362/311.02, 311.06, 311.09, 355, 327, 335, 362/249.02, 257, 296.05, 296.07
See application file for complete search history.

(56) References Cited

U.S. PATENT DOCUMENTS

| | | | | |
|---|---|---|---|---|
| 6,679,621 | B2* | 1/2004 | West et al. | 362/327 |
| 7,246,931 | B2* | 7/2007 | Hsieh et al. | 362/612 |
| 7,454,119 | B2* | 11/2008 | Hsieh et al. | 385/146 |
| 7,566,148 | B2* | 7/2009 | Noh et al. | 362/305 |
| 7,602,559 | B2* | 10/2009 | Jang et al. | 359/726 |
| 7,959,328 | B2* | 6/2011 | Wanninger | 362/309 |
| 8,052,307 | B2* | 11/2011 | Bak et al. | 362/257 |
| 8,118,457 | B2* | 2/2012 | Kanai | 362/327 |
| 8,297,799 | B2* | 10/2012 | Chou | 362/311.02 |
| 2005/0146879 | A1* | 7/2005 | Takahashi et al. | 362/296 |
| 2008/0025028 | A1* | 1/2008 | Gloisten et al. | 362/294 |
| 2009/0080185 | A1* | 3/2009 | McMillan | 362/231 |
| 2009/0273918 | A1* | 11/2009 | Falicoff et al. | 362/84 |
| 2010/0172140 | A1* | 7/2010 | Chen et al. | 362/311.02 |
| 2010/0188609 | A1* | 7/2010 | Matsuki et al. | 349/64 |
| 2010/0201911 | A1* | 8/2010 | Iiyama et al. | 349/61 |
| 2011/0157898 | A1* | 6/2011 | Kanai | 362/296.05 |
| 2012/0044700 | A1* | 2/2012 | Chen et al. | 362/311.02 |
| 2013/0027926 | A1* | 1/2013 | Chiu et al. | 362/235 |

* cited by examiner

*Primary Examiner* — Julie Bannan
(74) *Attorney, Agent, or Firm* — Haynes and Boone, LLP

(57) ABSTRACT

The present disclosure provides one embodiment of an illumination structure. The illumination structure includes a light-emitting diode (LED) device on a substrate; a lens secured on the substrate and over the LED device; and a diffuser cap secured on the substrate and covering the lens, wherein the lens and diffuser cap are designed and configured to redistribute emitting light from the LED device for wide angle illumination.

22 Claims, 10 Drawing Sheets

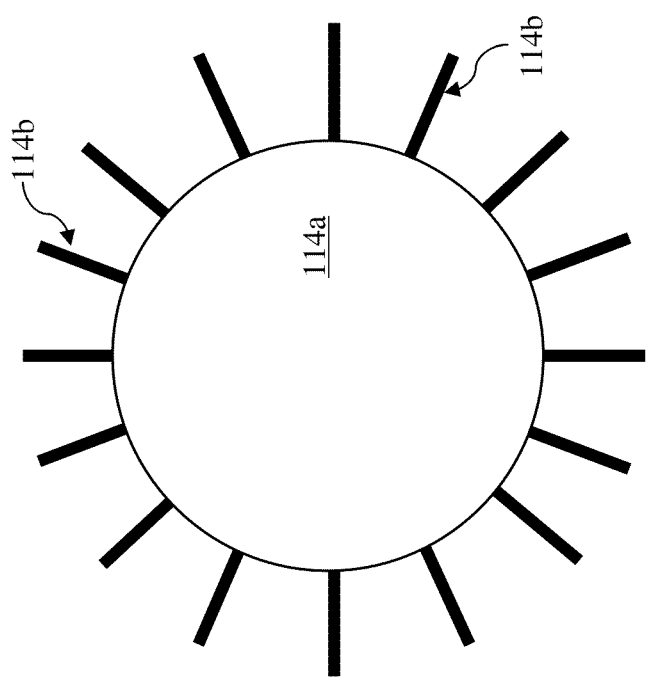

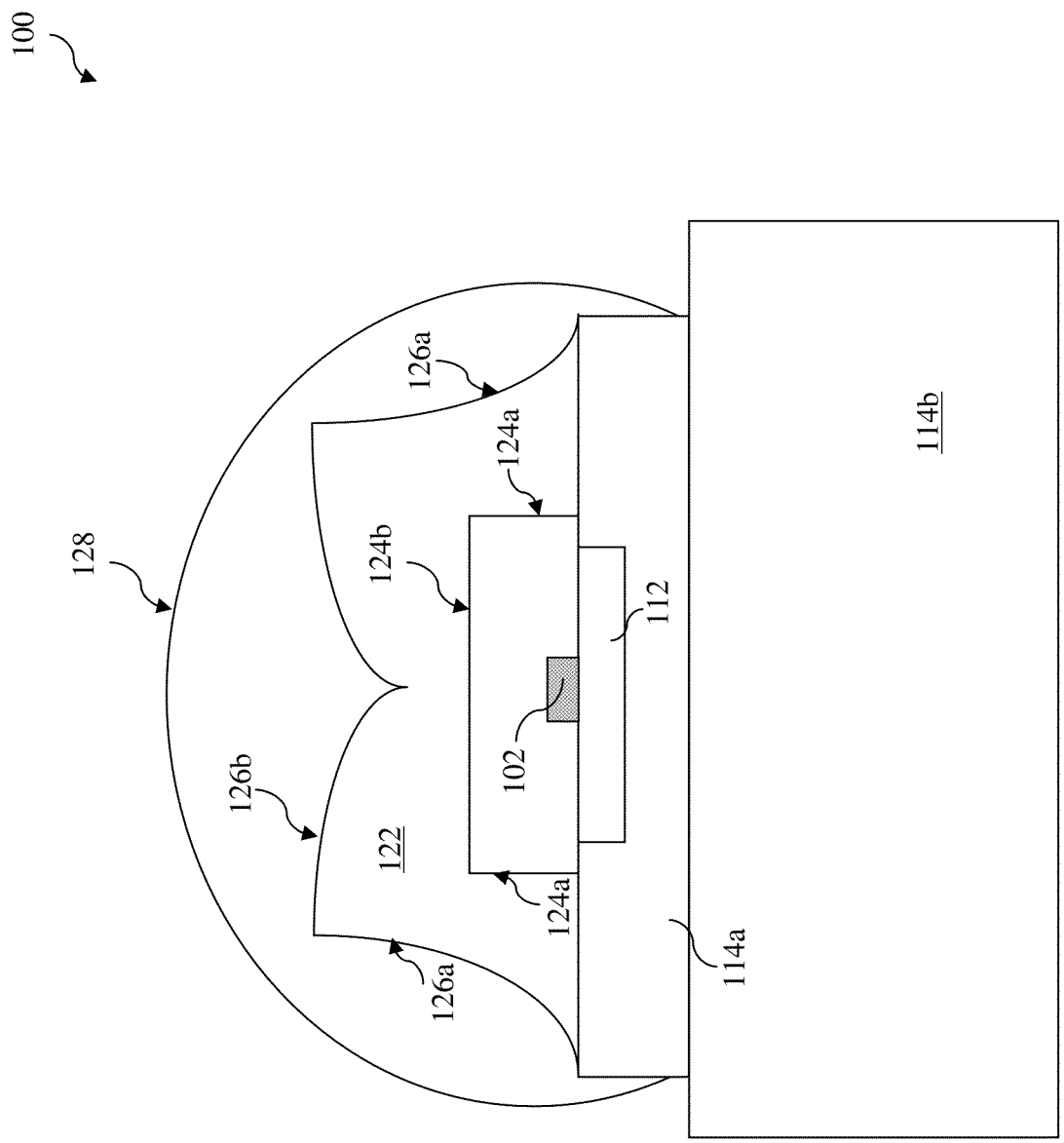

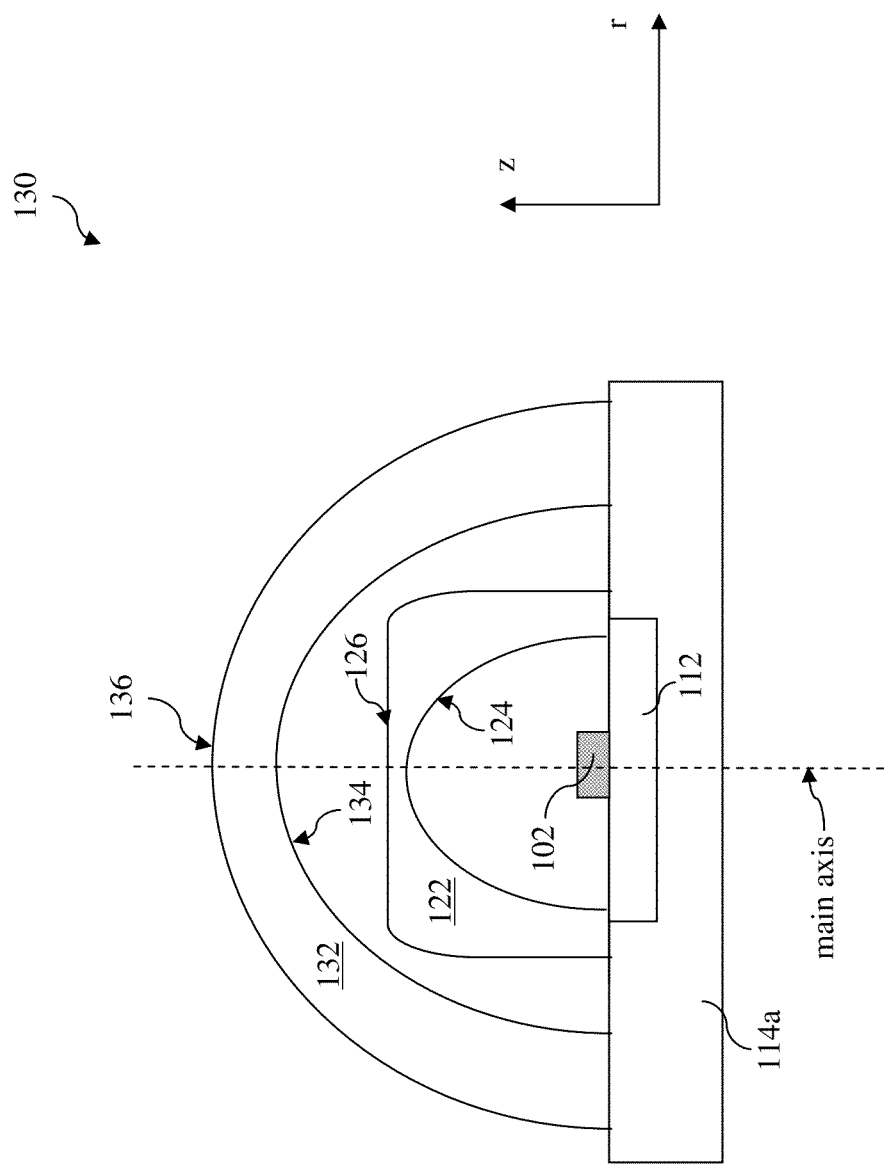

WIDE ANGLE BASED INDOOR LIGHTING LAMP

BACKGROUND

Light-emitting diodes (LEDs) are widely used in various applications, including indicators, light sensors, traffic lights, broadband data transmission, and illumination applications. Particularly, LEDs attract more interest for illumination applications due to their low power consumption and long lifetime. In illumination applications, LEDs have some limitations, such as narrow band spectrum. The narrow band spectrum can be overcome by integrating various types of LEDs to provide white light. Another limitation is directional emission. The emission light power from the LEDs is usually distributed in a small solid angle, which provides a narrow viewing angle and is dissimilar to natural illumination. Such directive illumination and bright forward lighting make human eyes uncomfortable and irritate the human eyes. Unless illumination in a specific direction is required for a special application, the narrow viewing angle of LED illumination is undesired, especially in indoor illumination uses. Currently, indoor LED lamps use a Lambertian based emitter and a diffuser-based cap to distribute the emitted light. However, those techniques for light distribution can only achieve up to 140 degree illumination and has little backward light. So, the LED emission is still directive and cannot form a uniform light distribution pattern. Therefore, structures and methods of LED structures are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a top view of a heat sink of the illumination structure of FIG. 1 constructed according to various aspects of the present disclosure in one embodiment;

FIGS. 5 through 8 and 12 are sectional views of an illumination structure constructed according to various embodiments;

DETAILED DESCRIPTION

Figure 1:
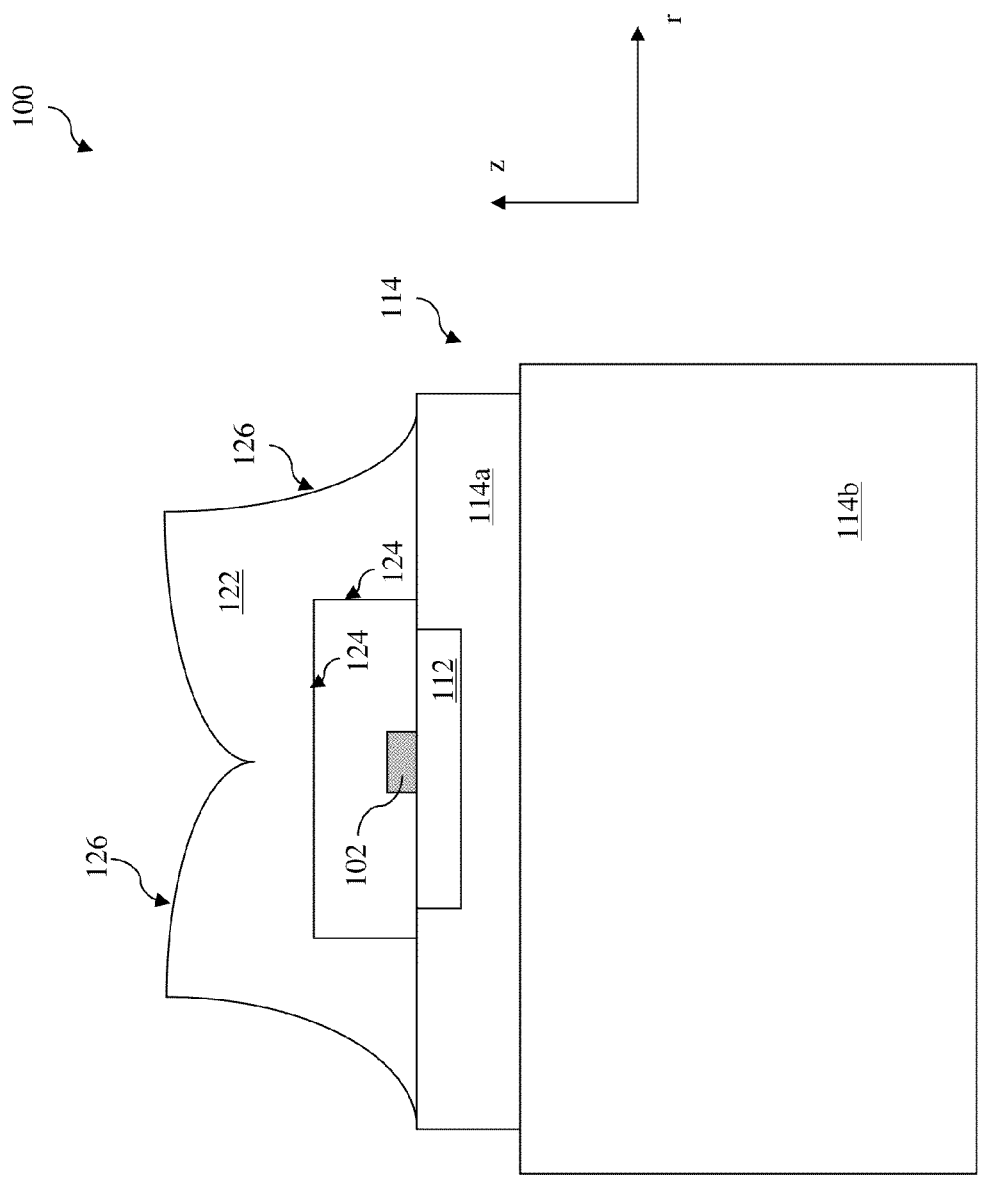
FIG. 1 is a sectional view of an illumination structure constructed according to one or more embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figure 3:
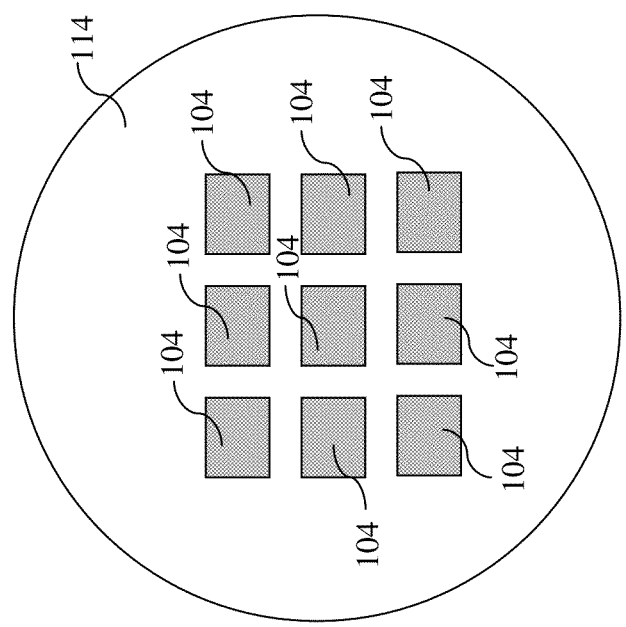
FIGS. 2 and 3 are top views of a light-emitting diode (LED) device incorporated in the illumination structure of FIG. 1 and constructed according to various embodiments.
Figure 2:
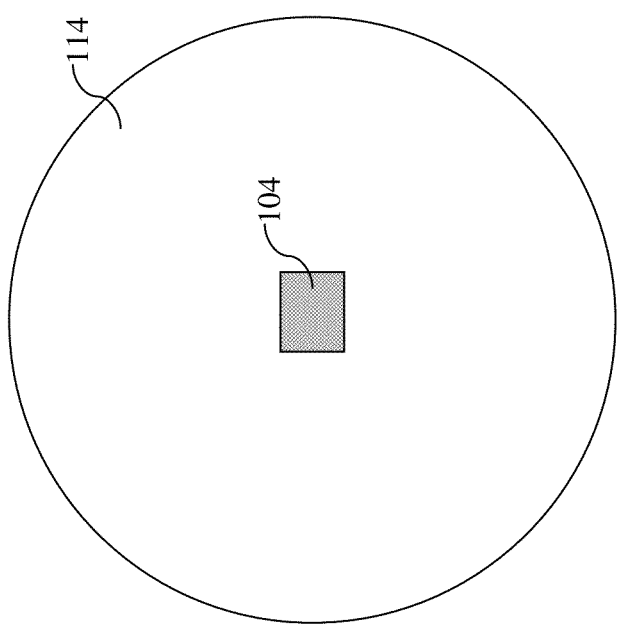

FIG. 1 is a sectional view of an illumination structure 100. FIGS. 2 and 3 are top views of a light-emitting diode (LED) device incorporated in the illumination structure 100 constructed according to various embodiments. FIG. 4 is a top view of a heat sink of the illumination structure 100 constructed according to various aspects in one embodiment. With reference to FIGS. 1 through 4, the illumination structure 100 and the method making the same are collectively described. The illumination structure 100 includes a LED device 102 as a light emitting source. The LED device 102 is coupled to a circuit board 112 and further attached to a substrate 114.

The LED device 102 includes one chip 104 as illustrated in FIG. 2 or a plurality of LED chips 104 as illustrated in FIG. 3. When the LED device 102 includes multiple LED chips 104, the multiple LED chips 104 are configured in a proper array for desired illumination effect. For example, the multiple LED chips 104 are configured such that the collective illumination from individual LED chips contributes the emitting-light in a large angle with enhanced illumination uniformity. In another example, the multiple LED chips 104 include individual LED chips 104, each being designed to provide visual light of different wavelengths or spectrum, such as a first subset of LED chips for blue and a second subset of LED chips for red. In this case, the various LED chips 104 collectively provide white illumination or other illumination effect according to particular applications. In various embodiments, each of the LED chips 104 includes one light emitting diode or a plurality of light emitting diodes. As one example, when a LED chip includes multiple light emitting diodes, those diodes are electrically connected in series for high voltage operation, or further electrically connected in groups of series-coupled Diodes in parallel to provide redundancy and device robustness.

As one example, the LED chip (or chips) 104 in the LED device 102 is further described below. The LED chip 104 includes a semiconductor p-n junction that can emit spontaneous radiation in ultraviolet, visual, or infrared regions of the electromagnetic spectrum. In one embodiment, the LED emits blue light. The LED chip 104 is formed on a growth substrate, such as a sapphire, silicon carbide, gallium nitride (GaN), or silicon substrate. In one embodiment, the LED chip 104 includes an n-type impurity doped cladding layer and a p-type doped cladding layer formed over the n-type doped cladding layer. In one example, the n-type cladding layer includes n-type gallium nitride (n-GaN), and the p-type cladding layer includes p-type gallium nitride (p-GaN). Alternatively, the cladding layers may include GaAsP, GaPN, AlInGaAs, GaAsPN, or AlGaAs doped with respective types. The LED chip 104 further includes a multi-quantum well (MQW) layer disposed between the n-GaN and p-GaN. The MQW structure includes two alternative semiconductors layers (such as indium gallium nitride/gallium nitride (InGaN/GaN)) and designed to tune the emission spectrum of the LED device. The LED chip 104 further includes electrodes electrically connected to the n-type impurity doped cladding layer and the p-type impurity doped cladding layer, respectively. For example, a transparent conductive layer, such as indium tin oxide (ITO), may be formed on the p-type impurity doped cladding layer. An n-electrode is formed and coupled with the n-type impurity doped cladding layer. In furtherance of the embodiment, the wiring interconnection may be used to couple the electrodes to terminals on a carrier substrate. The LED chip 104 may be attached to the carrier substrate through various conductive material, such as silver paste, soldering, or metal bonding. In another embodiment, other techniques, such as through silicon via (TSV) and/or metal traces, may be used to couple the light-emitting diode to the carrier substrate.

In another embodiment, phosphor is used to convert the emitted light to a different wavelength of light, which may be combined with the emitted light to produce a broader spectrum light, such as white light. The scope of embodiments is not limited to any particular type of LED, nor is it limited to any particular color scheme. In the depicted embodiment, one or more types of phosphors are disposed around the light-emitting diode for shifting and changing the wavelength of the emitted light, such as from ultra-violet (UV) to blue or from blue to red. The phosphor is usually in powder and is carried in other material such as epoxy or silicone (also referred to as phosphor gel). The phosphor gel is applied to the LED chip 104 with suitable technique and can be further shaped with proper shape and dimensions.

Various embodiments may employ any type of LED(s) appropriate for the application. For instance, conventional LEDs may be used, such as semiconductor based LEDs, Organic LEDs (OLEDs), Polymer LEDs (PLEDs), and the like. Various embodiments may find special utility in higher-output power LEDs to ensure light output similar to that expected of an incandescent bulb.

The LED chip 104 is further coupled to the circuit board 112 to provide electrical power and control to the LED chip 104. The circuit board 112 may be a portion of the carrier substrate. If more than one LED chip 104 is used, those LED chips 104 may share one circuit board. In the present embodiment, the circuit board 112 is a heat-spreading circuit board to effectively spread heat as well for heat dissipation. In one example, a metal core printed circuit board (MCPCB) is utilized. MCPCBs can conform to a multitude of designs. An exemplary MCPCB for use includes a PCB where the base material for the PCB includes a metal, such as aluminum, copper, a copper alloy, and/or the like. A thermally conductive dielectric layer is disposed upon the base metal layer to electrically isolate the circuitry on the printed circuit board from the base metal layer below. The LED chip 104 and its related traces can be disposed upon the thermally conductive dielectric material.

During normal operation, the LED chip 104 produces heat and light. Heat buildup can damage the LED chip 104 and/or reduce the light output over time for the LED chip 104. A MCPCB can effectively remove heat from the LED chip. Specifically, in one example, the heat from LED chip 104 is transferred by the thermally conductive dielectric material to the metal base. The metal base then transfers the heat to a heat sink, which dissipates heat into the ambient atmosphere. In other words, the thermally conductive dielectric layer and the metal base act as a heat bridge to carry heat efficiently and effectively from the LEDs to the heat sink.

In some examples, the metal base is directly in contact with the heat sink, whereas in other examples, a material intermediate heat sink and the circuit board 112 is used. Intermediate materials can include, e.g., double-sided thermal tape, thermal glue, thermal grease, and the like. Various embodiments can be adapted to use other types of MCPCBs. For instance, some MCPCBs include more than one trace layer, and such MCPCBs can be used when convenient. Circuit boards may be made of materials other than those mentioned above. In fact, any suitable material may be used, even materials with less thermal conductivity than those used in MCPCBs. For instance, other embodiments may employ circuit boards made of FR-4, ceramic, and the like.

In another example, the circuit board 112 may further include a power conversion module. Electrical power is typically provided to indoor lighting at alternating current (ac), such as 120V/60 Hz in the United States, and over 200V and 50 Hz in much of Europe and Asia, and incandescent lamps typically apply that power directly to the filament in the bulb. The LED device 102 needs the power conversion module to change power from the typical indoor voltages/frequencies (high voltage AC) to power that is compatible with the LED device 102 (direct current). Various embodiments may apply any desirable type of power to the LED arrays to achieve any desired lighting effect.

The substrate 114 is a mechanical base to provide mechanical support to the LED device 102. The substrate 114 includes a metal, such as aluminum, copper, or other suitable metal. The substrate 114 can be formed by a suitable technique, such as extrusion molding or die casting. The substrate 114 or at least a portion of the substrate 114 functions as a heat sink as well (therefore also referred to as heat sink 114). In one embodiment, the heat sink 114 is designed to have a top portion 114a with a first dimension to avoid shielding the backward light emitted from the LED device 102 and a bottom portion 114b with a second dimension greater than the first dimension, to provide effective heat dissipation. The first and second portions are connected with desired thermal conduction or formed in one piece. The first portion 114a of the heat sink 114 is designed to secure the LED device 104 and the circuit board 112.

To accomplish the heat management task while providing a pleasing light pattern, the heat sink 114 has a plurality of facets, each with a length dimension paralleled to a length dimension (also referred to as the first direction or z direction in FIG. 1) of the lamp itself according to another embodiment. The facets are central to the light bulb form factor and face outwardly therefrom.

To enhance heat transfer, the heat sink 114 has fins. In a particular example, the second portion 114b includes fins as illustrated in FIG. 4. Each of the fins is placed between two adjacent facets and protrudes outwardly from the central axis of the lamp. The fins have substantial surface area exposed to ambient atmosphere, thereby facilitating heat transfer from the center of the lamp to the air. The spaces between the fins provide a mechanism such that the emitted backward light (the solid angle greater than $2\pi$ steradians) can substantially pass through without being blocked.

The illumination structure 100 includes a lens 122 configured around the LED device 102. The lens 122 includes an inner surface 124 and an outer surface 126. The inner surface 124 and the outer surface 126 are designed with respective shapes and sizes to effectively redistribute the emitted light from the LED device 102 to a wide angle. In one example, the outer surface 126 of the lens 122 is designed to include a concave recess such that the outer surface 126 is sloped down toward the center. More specifically, the outer surface of the lens 122 has a central portion lower than the rim, when measured in the first direction (z direction).

The lens 122 includes a material substantially transparent to the emitted light from the LED device 102. In one example, the transmittance to the emitted light from the LED device 102 is greater than about 90%. In various embodiments, the lens 122 includes poly methyl methacrylate (PMMA), polycarbonate (PC), or other suitable material. The lens 122 can be formed by any suitable technique, such as injection molding or extrusion molding. With the lens 122 properly designed and configured, the emitted light from the LED device 102 can be redistributed to beyond $2\pi*[1-\cos(100\pi/180)]$ steradian in solid angle. A second lens or more lenses may be integrated to the illumination structure 100 to further enhance the wide angle illumination. Various embodiments of the illumination structure 100 are described below. Those embodiments are provided for illustration of the present disclosure without intention to limit the scope of the present disclosure.

Figure 5:
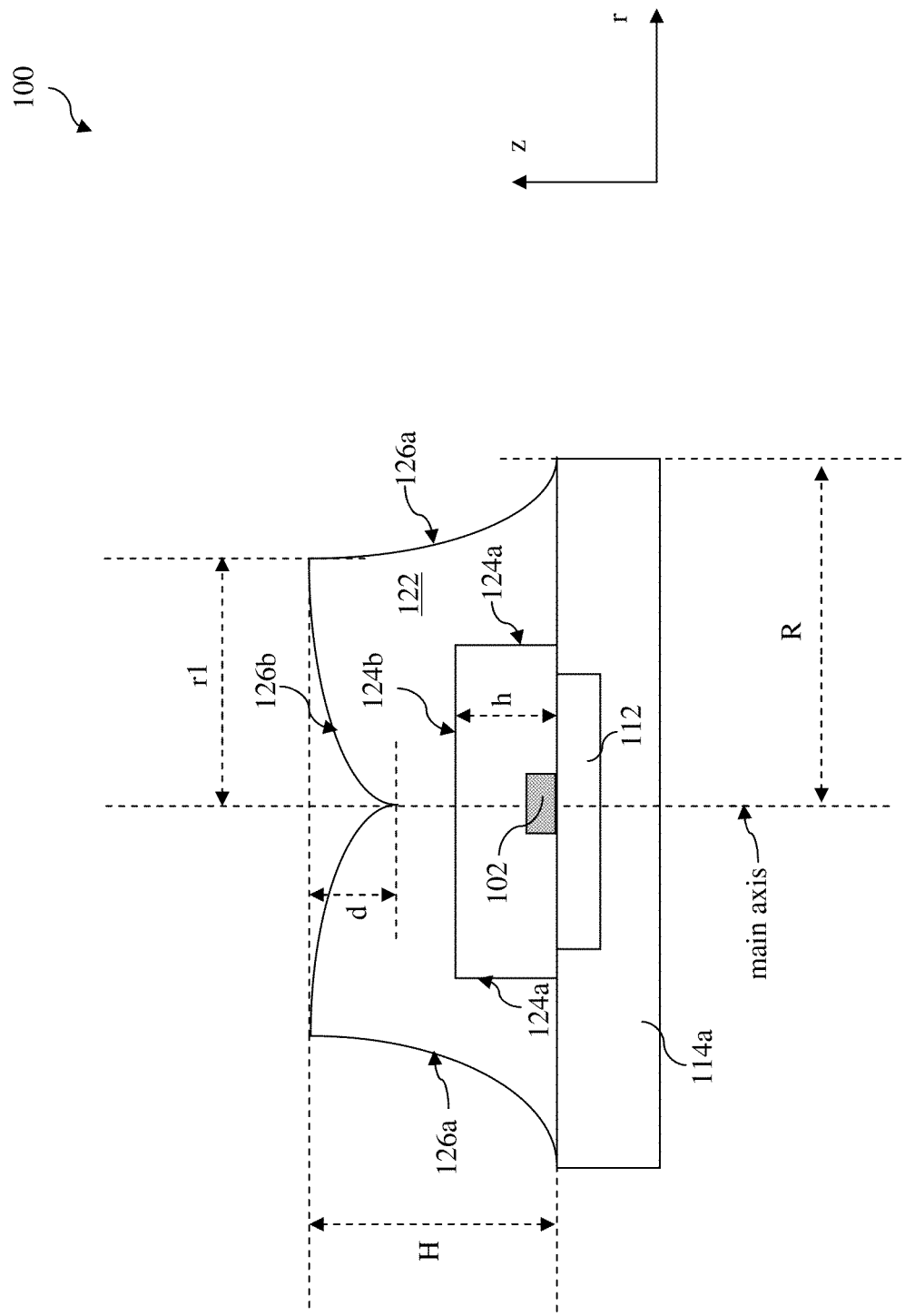

FIG. 5 provides a sectional view of the illumination structure 100 (in portion for simplicity) constructed according to various aspects in one embodiment. The illumination structure 100 includes the lens 122 having the inner surface 124 and the outer surface 126. In one embodiment, the inner surface 124 includes a first side surface (or inner side surface) 124a and a first top surface (or inner top surface) 124b. The outer surface 126 includes a second side surface (or outer side surface) 126a and a second top surface (or outer top surface) 126b.

The first lens 122 is designed to effectively redistribute the emitted light from the LED device 102 to more than 100 degrees in vertex angle or $2\pi*[1-\cos(100\pi/180)]$ steradian in solid angle. In one embodiment, the inner surface 124 is designed to have an angle defined from the LED device 102 to the edge (or rim), where the inner side surface 124a and the inner top surface 124b meet. In this embodiment, the defined angle ranges between about 70 degrees and 90 degrees. In another embodiment, the inner top surface 124b includes a geometry, such as plane, convex surface, or concave surface. In yet another embodiment, the outer side surface 126a includes a geometry, such as plane, convex surface, or concave surface. In yet another embodiment, the outer top surface 126b includes a geometry, such as plane, convex surface, or concave surface.

Figure 5A:
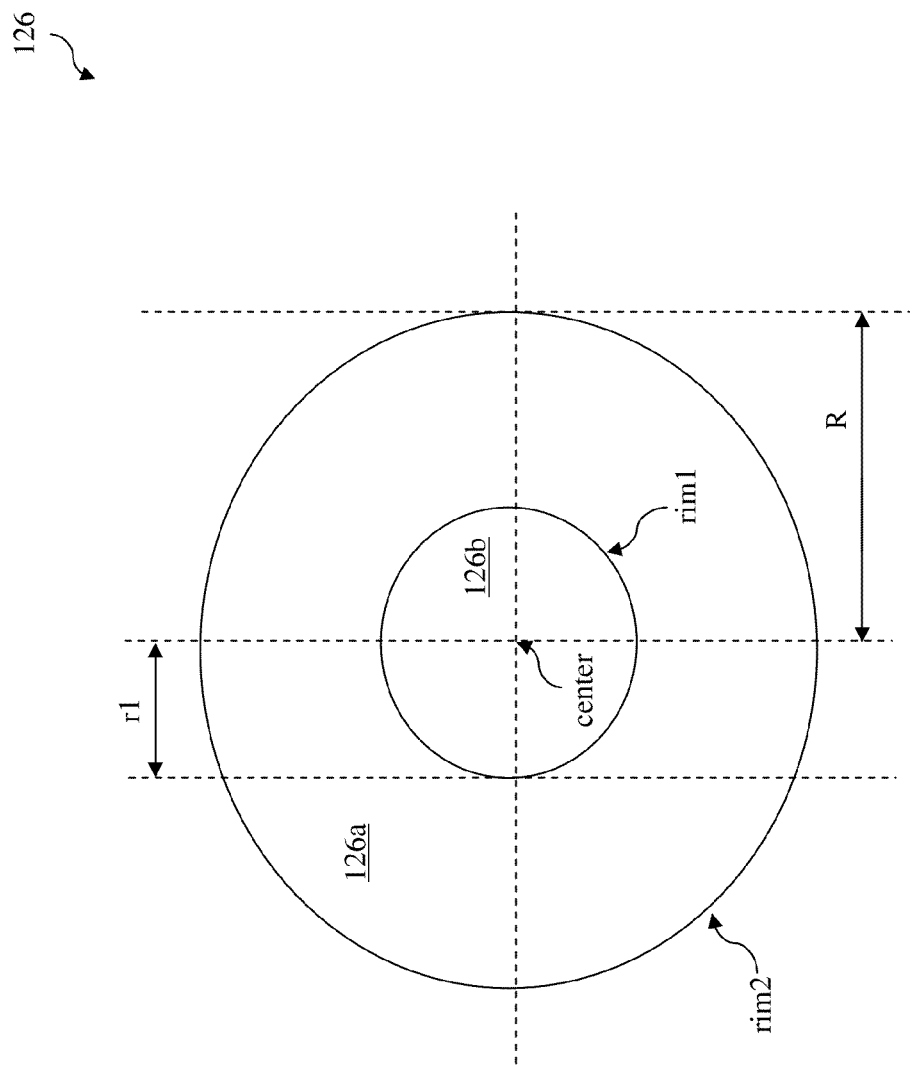
FIG. 5a is a top view of a lens in the illumination structure of FIG. 5 constructed according to one embodiment.

The inner top surface 124b is spaced away from the substrate 114 along the first direction (z direction), defining a first height h to the substrate 114, as illustrated in FIG. 5. FIG. 5a illustrates a top view of a portion of the lens 122 in the illumination structure 100. Specifically, only the outer surface 126 (126a and 126b) of the lens 122 is illustrated in FIG. 5a. With reference to both FIG. 5 and FIG. 5a, the outer surface 126 is further described. In the top view, the outer top surface 126b includes a center (labeled as "center") and a rim (or first rim and labeled as "rim1") as shown in FIG. 5a. The outer top surface 126b spans along a second direction, from the center to the first rim, defining a first radius "r1". The second direction is perpendicular to the first direction as illustrated in FIG. 5 and also referred to as r direction. The outer side surface 126a defines a round area on the substrate 114 and the round area has a second radius R along the second direction. Particularly, the outer side surface 126a contacts the outer top surface 126b at the first rim and contacts the substrate 114 at a second rim (labeled as "rim2"). The second radius R is defined from the center to the second rim along the second direction.

Similarly, the inner top surface 126a also includes a center. A virtual line is defined along the first direction and passes through the center of the inner top surface 126a and the center of the outer top surface 126b. This virtual line is referred to as a main axis in FIG. 5.

The outer top surface 126b is spaced away from the substrate 114 along the first direction (z direction), defining a second height H between the first rim to the substrate 114. In the present embodiment, the outer top surface 126b includes a concave recess such that the first rim is higher than the center of the outer top surface 126b. The outer top surface 126b is sloped such that it is closer to the substrate 102 when approaching from the first rim to the center. The concave recess of the outer top surface 126b can be measured by a parameter d defined as a distance between the center of the outer top surface to the first rim of the outer top surface along the first direction, as illustrated in FIG. 5.

Figure 6:
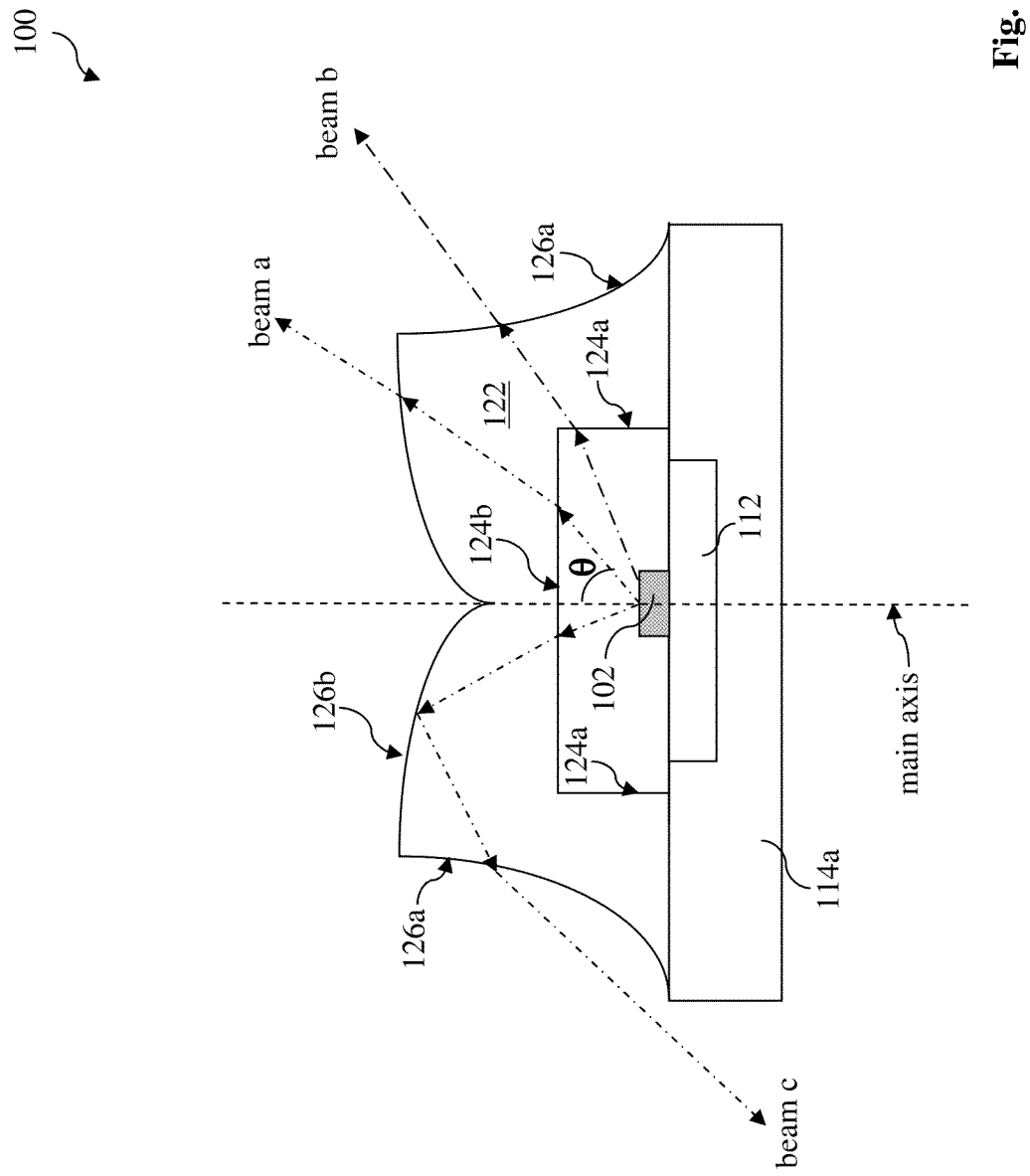

In one embodiment, the inner surface 124 and the outer surface 126 are designed to effectively redistribute the emitted light with a redistribution mechanism that will be further described below with the reference to FIG. 6. To achieve this redistribution mechanism, the lens 122 is designed to have various ratios among the above defined dimensions according to various examples. In one example, a first ratio is defined as r/R and the first ratio r/R ranges between about 0.3 and about 1.0. In another example, a second ratio is defined as d/H and the second ratio d/H ranges between about 0.5 and about 0.8. In another example, a third ratio is defined as h/H and the third ratio h/H ranges between about 0.1 and about 0.4.

The illumination structure 100 having the lens 122 in FIG. 5 is further explained with reference to FIG. 6 for the redistribution mechanism according to one or more embodiments. During the operation of the illumination structure 100, the LED device 102 emits light. The emitted light is distributed in a cone with a vertex angle of 90 degree or less. The vertex angle is measured with a reference to the main axis as illustrated in FIG. 6. The corresponding solid angle is $27c$ steradian or less. The emitted light passes through the lens 122 and is redistributed by the various surfaces of the lens 122, including the inner side surface 124a, the inner top surface 124b, the outer side surface 126a, and the outer top surface 126b. As an example for explanation purpose, the emitted light from the LED device 102 includes a first beam (labeled as "beam a"), a second beam (labeled as "beam b"), and a third beam (labeled as "beam c"). The first beam is originally directed in a solid angle such that it passes through the inner top surface 124b and then passes through the outer top surface 126b as illustrated in FIG. 6. The first beam is redirected to a vertex angle between 0 degrees and about 45 degrees. The corresponding solid angle ranges between 0 steradian and about $2\pi*[1-\cos(\pi/4)]$ steradian. The second beam is originally directed in a solid angle such that it passes through the inner side surface 124a and then passes through the outer side surface 126a as illustrated in FIG. 6. The second beam is redirected to a vertex angle between about 45 degrees and about 100 degrees. The corresponding solid angle ranges between about $2\pi*[1-\cos(\pi/4)]$ steradian and about $2\pi*[1-\cos(100\pi/180)]$ steradian. The third beam is originally directed in a solid angle such that it passes through the inner top surface 124b, reflects at the outer top surface 126b and then passes through the outer side surface 126a as illustrated in FIG. 6. The third beam is redirected to a vertex angle between about 100 degrees and 180 degrees. The corresponding solid angle ranges between about $2\pi*[1-\cos(100\pi/180)]$ steradian and $4\pi$ steradian. Thus, by the lens 122 with the designed inner surface 124 and the outer surface 126, the emitted light from the LED device 102 is redistributed in a wide angle. In the depicted example, the emitted light from the LED device 102 is redistributed to a full solid angle from 0 to $4\pi$ steradian.

FIG. 7 provides a sectional view of the illumination structure 100 (in portion for simplicity) constructed according to various aspects in another embodiment. The illumination structure 100 of FIG. 7 is similar to the illumination structure 100 in FIG. 5 but further includes a diffuser cap 128. The diffuser cap 128 is secured to the top portion 114a of the substrate 114 in one embodiment. The diffuser cap 128 is designed with a proper material to diffuse the emitted light from the LED device 102 for uniform illumination. Particularly, the redistributed light from the lens 122 is diffused by the diffuser cap 128. In one embodiment, the diffuser cap 128 includes a transparent material, such as PC, PMMA, or other suitable material. The diffuser cap can be formed by a suitable technique, such as injection molding or plastic blow. The diffuser cap 128 further includes diffusion particles dispersed in the transparent material for the light diffusion effect. The sizes and concentration of the diffusion particles are designed to effectively diffuse the emitted light.

By the lens 122 and the diffuser cap 128 integrated in the illumination structure 100, the emitted light from the LED device 102 is redistributed more uniformly in the wide angle. In one example, the light uniformity is less than about 20% in the solid angle zone between 0 and about $2\pi*[1-\cos(135\pi/180)]$ steradian. The light uniformity is defined as a percentage that the luminous intensity at any angle in the solid angle zone (in the depicted example, between 0 and about $2\pi*[1-\cos(135\pi/180)]$ steradian) shall not differ from the mean intensity for that entire angle zone by more than that percentage. In the depicted example, the percentage is 20%. In a particular example, the light uniformity can be formulated as $|I-I_{ave}|/I_{ave}$. In this formula, the parameter I is the luminous intensity at any angle in the defined angle zone. The parameter $I_{ave}$ is defined as the mean luminous intensity over the defined angle zone. In the above example, the light uniformity is $|I-I_{ave}|/I_{ave} \leq 20\%$. In the furtherance of the example, the light uniformity for the backward light is $|I-I_{ave}|/I_{ave} \leq 5\%$. In this example, the backward light is defined as the redistributed light from the LED device 102 within the solid angle between about $2\pi*[1-\cos(135\pi/180)]$ steradian and $4\pi$ steradian.

FIG. 8 provides a sectional view of an illumination structure 130 (in portion for simplicity) constructed according to various aspects in another embodiment. The illumination structure 130 of FIG. 8 is similar to the illumination structure 100 in FIG. 5 considering other components, such as the LED device 102, the circuit board 112, and the substrate 114. However, the illumination structure 130 includes a first lens 122 configured around the LED device 102 and a second lens 132 around the first lens 122. The first lens 122 includes a first inner surface 124 and a first outer surface 126. The second lens 122 includes a second inner surface 134 and a second outer surface 136. The various surfaces of the first and second lenses 122 and 132 are designed to effectively redistribute the emitted light from the LED device 102 to a wide solid angle, such as $>2\pi*[1-\cos(100\pi/180)$. In one embodiment, each of the various surfaces (including the first inner surface 124, the first outer surface 126, the second inner surface 134, and the second outer surface 136) of the first and second lenses 122 and 132 is designed to have respective shape and size such that the light emitted from the LED device 102 and passed through the first and second lenses is effectively redistributed into a wide angle. Particularly, the second inner surface 134 and the second outer surface 136 of the second lens 132 are designed and configured to be able to refract the emitted light backward (to a solid angle greater than $2\pi$ steradian).

Figure 10:
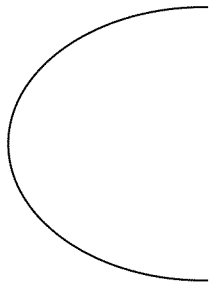
FIGS. 9 through 11 are sectional views of lens surface shape in the illumination structures of FIG. 8 according to various embodiments.
Figure 11:
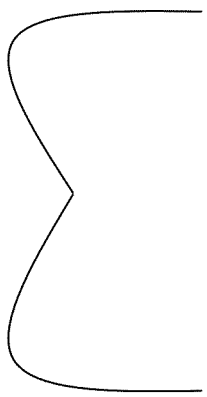
Figure 9:
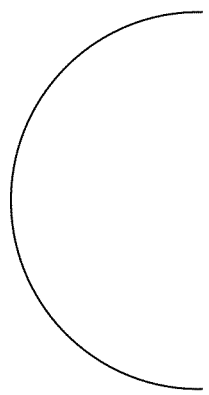

In one embodiment, each of the various surfaces (including the first inner surface 124, the first outer surface 126, the second inner surface 134, and the second outer surface 136) of the first and second lenses 122 and 132 is designed to have a respective geometry selected from the group consisting of a hemisphere (illustrated in FIG. 9), a semiellipse (illustrated in FIG. 10), and a surface having a top portion with a concave recess and a side portion (illustrated in FIG. 11). FIGS. 9 through 11 are sectional views of a surface geometry constructed according to various aspects in one or more embodiments. Particularly, the surface geometry in FIG. 11 has a height peak off from the center. In a particular embodiment, at least one of those surfaces (124, 126, 134, and 136) is shaped to have a top portion with a concave recess and a side portion as illustrated in FIG. 11.

The second lens 132 spans along the first direction (z direction) with a first dimension and spans along the second direction (r direction) with a second dimension. In one embodiment, the first dimension ranges between about 20 mm and about 40 mm. In another embodiment, the second dimension ranges between about 30 mm and about 60 mm.

At least one of the first lens 122 and second lens 132 includes a high transparent material, such as a material with a transmittance greater than about 90%. In one embodiment, the high transparent material includes glass or polymeric material. In various embodiments, the high transparent material includes PMMA or PC formed by a suitable technique, such as injection molding. In another embodiment, the second lens 132 includes a diffuser-like material with a high transmittance. For example, the second lens 132 includes a material having a transmittance greater than about 90% and a cloudiness greater than about 80%. In one example, the second lens 132 includes a transparent material (such as PC or PMMA) dispersed with diffusion particles for light diffusion effect.

In an alternative embodiment, the illumination structure 130 further includes a third lens or more lenses to effectively redistribute the emitted light from the LED device 102 to a wide angle and with a high angle uniformity.

Figure 12:
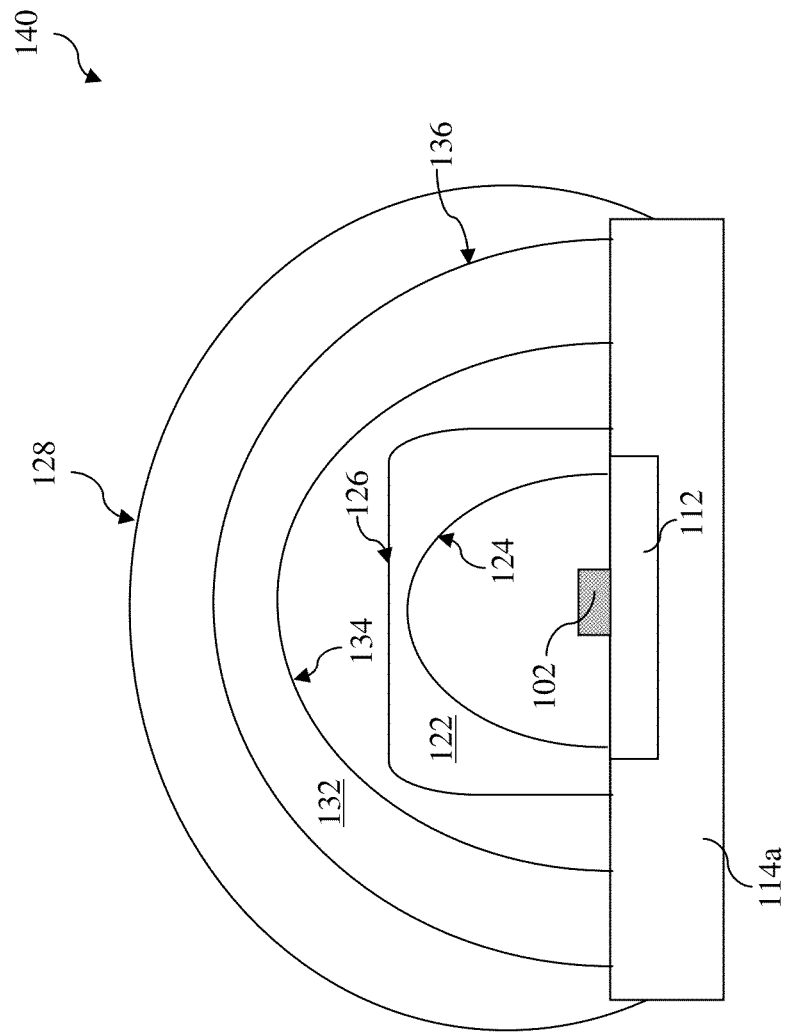

FIG. 12 provides a sectional view of an illumination structure 140 (in portion for simplicity) constructed according to various aspects in another embodiment. The illumination structure 140 of FIG. 12 is similar to the illumination structure 130 in FIG. 8 but further includes a diffuser cap 128. Particularly, the illumination structure 140 includes the first lens 122 and the second lens 132 formed with one or more transparent materials. The illumination structure 140 further includes the diffuser cap 128 secured to the top portion 114a of the substrate 114 in one embodiment. The diffuser cap 128 is designed with a proper material to diffuse the emitted light from the LED device 102 for uniform illumination over different angles. Particularly, the redistributed light from the first lens 122 and the second lens 132 is further diffused by the diffuser cap 128. In one embodiment, the diffuser cap 128 includes a transparent material, such as PC, PMMA, or other suitable material. The diffuser cap 128 can be formed by a suitable technique, such as injection molding or plastic blow. The diffuser cap 128 further includes diffusion particles dispersed in the transparent material for the light diffusion effect.

Although various embodiments are provided and explained in the present disclosure. Other alternatives and embodiments may be used without departure from the spirit of the present disclosure. In one embodiment, the various surfaces of the first lens 122 and/or the second lens 132 may be designed with different geometries, respectively, for desired light redistribution. In another embodiment, the lens 122 (and/or the lens 132) has a batwing structure. A batwing lens has prism-shaped ribs to refract the light sideways. Particularly, one of the surfaces (124, 126 134, and 136) has a batwing structure. In one example for a lens surface having a batwing structure, the lens surface is similar to the geometry in FIG. 11 but includes multiple peaks and dips in the sectional view, such as a wave-like surface profile.

Thus, the present disclosure provides an illumination structure. The illumination structure includes a light-emitting diode (LED) device on a substrate; a lens secured on the substrate and over the LED device; and a diffuser cap secured on the substrate and covering the lens, wherein the lens and diffuser cap are designed and configured to redistribute emitting light from the LED device for wide angle illumination.

In one embodiment, the lens includes an inner surface and an outer surface; the inner surface includes a first side portion and a first top portion; the outer surface includes a second side portion, and a second top portion; and the first side portion, the first top portion, the second side portion and the second top portion are designed and configured to redistribute the light emitted from the LED device to a solid angle more than $2\pi$ steradian.

In another embodiment, the first side portion, the first top portion, the second side portion, and the second top portion are designed and configured such that during an operation of the illumination structure that the emitted light includes a first light beam passing through the first top portion and the second top portion that is distributed within a first solid angle between 0 steradian and about $2\pi*[1-\cos(\pi/4)]$ steradian; a second light beam passing through the first side portion and the second side portion that is distributed within a second solid angle between about $2\pi*[1-\cos(\pi/4)]$ steradian and about $2\pi*[1-\cos(100\pi/180)]$ steradian; and a third light beam passing through the first top portion, reflecting from the second top portion, and passing through the second side portion that is distributed within a third solid angle between about $2\pi*[1-\cos(100\pi/180)]$ steradian and $4\pi$ steradian.

In yet another embodiment, the second top portion has a concave recess. In this embodiment, the second top portion includes a center and a rim surrounding the center; the second top portion is spaced away from the substrate along a first direction, defining a height H from the rim of the second top portion to a top surface of the substrate along the first direction; the second top portion spans from the center to the rim along a second direction perpendicular to the first direction, defining a first radius r; the concave recess includes a recess depth d defined as a distance from the rim to the center along the first direction; and a first ratio d/H ranges between about 0.5 and about 0.8.

Various other embodiments are provided below. The second side portion defines a round area on the substrate, and the round area has a second radius R along the second direction; and a second ratio r/R may range between about 0.3 and about 1.0. The first top portion is spaced away from the substrate along the first direction, defining a height h to the top surface of the substrate; and a third ratio h/H may range between about 0.1 and about 0.4.

The illumination structure may further include a second lens covering the first lens and configured inside the diffuser cap. The substrate may include a mechanical base. The mechanical base may include a thermal conductive material and is designed as a heat sink. In another embodiment, the mechanical base includes a first portion adjacent the LED device and a second portion remote from the LED device; the first portion and the second portion are configured along a first direction; the first portion has a first dimension along a second direction perpendicular to the first direction; the second portion has a second dimension along the second direction; and the second dimension is greater than the first dimension. The illumination structure further includes a heat spreading circuit board electrically coupled with the LED device; and configured between the LED device and the substrate.

The present disclosure also provides another embodiment of an illumination structure. The illumination structure includes a light-emitting diode (LED) device configured on a substrate; a first lens secured on the substrate and covering the LED device; and a second lens secured on the substrate and covering the first lens, wherein the first lens and the second lens are shaped and configured to redistribute emitting light from the LED device for wide angle illumination.

In one embodiment of the disclosed illumination structure, the first lens includes a first inner surface facing toward the LED device and a first outer surface facing away from the LED device; the second lens includes a second inner surface facing toward the LED device and a second outer surface facing away from the LED device; and each of the first inner surface, the first outer surface, the second inner surface, and the second outer surface is designed to have a shape selected from the group consisting of a portion of a hemisphere, a semiellipse, and a portion of a hemisphere, a portion of a semiellipse, and a surface having a top portion with concave recess and a side portion. In another embodiment, each of the first lens and the second lens includes a transparent material selected from the group consisting of polycarbonate (PC) and poly(methyl methacrylate) (PMMA). The second lens may further include diffusion particles dispersed in a transparent material for light diffusing effect. The LED device may include a plurality of LED chips configured on the substrate. The first lens may be shaped with a batwing structure. The illumination structure may further include a third lens cascaded with the first lens and the second lens to further redistribute the light emitted from the LED device.

The present disclosure also provides an embodiment of a method of masking an illumination structure. The method includes attaching a light-emitting diode (LED) device to a substrate; attaching a first lens to the substrate, the first lens covering the LED device; and attaching a second lens to the substrate, the second lens covering the first lens. The method may further include forming the first lens shaped to redistribute emitting light from the LED device for wide angle illumination, before the attaching the first lens to the substrate. The forming of the first lens may include utilizing a technique selected from the group consisting of injection molding and extrusion molding.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An illumination structure comprising: a light-emitting diode (LED) device on a substrate; a lens secured on the substrate and over the LED device, and wherein a gap exists between the LED device and the lens; and a diffuser cap secured on the substrate and covering the lens, wherein the lens and diffuser cap are designed and configured to redistribute emitting light from the LED device for wide angle illumination; and wherein: the lens includes an inner surface and an outer surface; the inner surface includes a first side portion and a first top portion; the outer surface includes a second side portion and a second top portion, the second side portion extending from a bottom surface and having a concave curved cross-sectional profile configured in a manner such that a bottom of the second side portion protrudes further out from a center of the lens than a top of the second side portion.

2. The illumination structure of claim 1, wherein the first side portion, the first top portion, the second side portion, and the second top portion are designed and configured to redistribute light emitted from the LED device to a solid angle more than $2\pi$ steradian.

3. The illumination structure of claim 2, wherein the first side portion, the first top portion, the second side portion, and the second top portion are designed and configured such that during an operation of the illumination structure the emitted light includes:
a first light beam passing through the first top portion and the second top portion that is distributed within a first solid angle between 0 steradian and about $2\pi*[1-\cos(\pi/4)]$ steradian;
a second light beam passing through the first side portion and the second side portion that is distributed within a second solid angle between about $2\pi*[1-\cos(\pi/4)]$ steradian and about $2\pi*[1-\cos(100\pi/180)]$ steradian; and
a third light beam passing through the first top portion, reflecting from the second top portion, and passing through the second side portion that is distributed within a third solid angle between about $2\pi*[1-\cos(100\pi/180)]$ steradian and $4\pi$ steradian.

4. The illumination structure of claim 2, wherein the second top portion has a concave recess.

5. The illumination structure of claim 4, wherein
the second top portion includes a center and a rim surrounding the center;
the second top portion is spaced away from the substrate along a first direction, defining a height H from the rim of the second top portion to a top surface of the substrate along the first direction;
the second top portion spans from the center to the rim along a second direction perpendicular to the first direction, defining a first radius r;
the concave recess includes a recess depth d defined as a distance from the rim to the center along the first direction; and
a first ratio d/H ranges between about 0.5 and about 0.8.

6. The illumination structure of claim 5, wherein
the second side surface defines a round area on the substrate and the round area has a second radius R along the second direction; and
a second ratio r/R ranges between about 0.3 and about 1.0.

7. The illumination structure of claim 6, wherein
the first top portion is spaced away from the substrate along the first direction, defining a height h to the top surface of the substrate; and
a third ratio h/H ranges between about 0.1 and about 0.4.

8. The illumination structure of claim 1, further comprising a second lens covering the first lens and configured inside the diffuser cap.

9. The illumination structure of claim 1, wherein the substrate includes a mechanical base.

10. The illumination structure of claim 9, wherein the mechanical base includes a thermal conductive material and is designed as a heat sink.

11. The illumination structure of claim 9, wherein
the mechanical base includes a first portion adjacent the LED device and a second portion remote from the LED device;
the first portion and the second portion are configured along a first direction;
the first portion has a first dimension along a second direction perpendicular to the first direction;
the second portion has a second dimension along the second direction; and
the second dimension is greater than the first dimension.

12. The illumination structure of claim 1, further includes a heat spreading circuit board electrically coupled with the LED device; and configured between the LED device and the substrate.

13. The illumination structure of claim 1, wherein the second side portion has a concave shape.

14. An illumination structure comprising: a light-emitting diode (LED) device disposed over a substrate; and a lens disposed over the substrate and over the LED device; wherein: the lens includes an inner surface facing toward the LED device and an outer surface facing away from the LED device; the outer surface includes a curved top surface and a concave side surface; concave side surface extending from a bottom surface of said lens and being shaped such that the lens has a larger radius at a bottom of the lens than at a top of the lens; and the curved top surface has a vertex.

15. The illumination structure of claim 14, wherein the curved top and side surfaces are each configured to resemble a portion of a hemisphere or a portion of a semi-ellipse.

16. The illumination structure of claim 14, further comprising a diffuser cap disposed over the substrate and housing the LED device and the lens within.

17. The illumination structure of claim 14, wherein the lens includes a transparent material selected from the group consisting of polycarbonate (PC) and poly methyl methacrylate (PMMA).

18. The illumination structure of claim 14, wherein the LED device includes a plurality of LED chips.

19. The illumination structure of claim 14, wherein the lens is shaped as a batwing structure.

20. The illumination structure of claim 14, wherein:
the top surface defines a concave recess, and wherein a lowest point of the recess is the vertex and is centered around the LED device; and
the side surface has a concave shape in a cross-sectional view.

21. An illumination structure, comprising: a light-emitting diode (LED) device disposed over a substrate, the LED device including one or more LED chips; a batwing-shaped lens disposed over the substrate and over the LED device, wherein the one or more LED chips are each spaced apart from the batwing-shaped lens; and a diffuser cap disposed over the substrate and housing the LED device and batwing-shaped lens therein; wherein: an upper surface of the batwing-shaped lens defines a concave recess, that includes a vertex, and wherein the vertex defines a lowest point of the upper surface and is being aligned with a center of the LED device; a side surface extending from a bottom surface of the batwing-shaped lens has a concave and non-flat cross-sectional profile; and a first radius of a bottom portion of the batwing-shaped lens is greater than a second radius of a top portion of the batwing-shaped lens.

22. The illumination structure of claim 21, wherein the batwing-shaped lens includes a transparent material selected from the group consisting of polycarbonate (PC) and poly methyl methacrylate (PMMA).

* * * * *